(12) United States Patent
Frink et al.

(10) Patent No.: US 9,411,525 B2
(45) Date of Patent: *Aug. 9, 2016

(54) MODULAR MASS STORAGE SYSTEM

(71) Applicant: Amazon Technologies, Inc., Reno, NV (US)

(72) Inventors: Darin Lee Frink, Lake Tapps, WA (US); Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 132 days.

This patent is subject to a terminal disclaimer.

(21) Appl. No.: 14/292,528

(22) Filed: May 30, 2014

(65) Prior Publication Data

US 2014/0281224 A1  Sep. 18, 2014

Related U.S. Application Data

(63) Continuation of application No. 13/069,065, filed on Mar. 22, 2011, now Pat. No. 8,743,549.

(51) Int. Cl.
| | |
|---|---|
| *H05K 7/20* | (2006.01) |
| *G06F 3/06* | (2006.01) |
| *G06F 1/18* | (2006.01) |
| *G11B 33/12* | (2006.01) |
| *G11B 33/14* | (2006.01) |
| *G06F 1/20* | (2006.01) |

(52) U.S. Cl.
CPC ............. *G06F 3/0619* (2013.01); *G06F 1/181* (2013.01); *G06F 1/187* (2013.01); *G06F 1/20* (2013.01); *G06F 3/0655* (2013.01); *G06F 3/0689* (2013.01); *G11B 33/128* (2013.01); *G11B 33/142* (2013.01); *H05K 7/20572* (2013.01)

(58) Field of Classification Search
CPC .................................................. H05K 7/20572
USPC ................................... 361/679.49, 679.5, 724
See application file for complete search history.

(56) References Cited

U.S. PATENT DOCUMENTS

| | | | |
|---|---|---|---|
| 5,282,099 A | 1/1994 | Kawagoe et al. | |
| 5,506,750 A | 4/1996 | Carteau et al. | |
| 5,757,617 A | 5/1998 | Sherry | |
| 5,912,799 A | 6/1999 | Grouell et al. | |
| 6,234,591 B1 | 5/2001 | Driscoll et al. | |

(Continued)

FOREIGN PATENT DOCUMENTS

JP    2000149524    5/2000

OTHER PUBLICATIONS

U.S. Appl. No. 13/069,065, filed Mar. 22, 2011, Darin Lee Frink.

(Continued)

*Primary Examiner* — Anthony Q Edwards
(74) *Attorney, Agent, or Firm* — Robert C. Kowert; Meyertons, Hood, Kivlin, Kowert & Goetzel, P.C.

(57) ABSTRACT

A system for storing data includes a rack, one or more data storage modules coupled to the rack, and one or more data control modules coupled to the rack. The data storage modules may include a chassis, two or more backplanes coupled to the chassis, and one or more mass storage devices (for example, hard disk drives) coupled to the backplanes. The data control modules may access the mass storage devices in the data storage modules.

20 Claims, 10 Drawing Sheets

(56) References Cited

U.S. PATENT DOCUMENTS

| | | | |
|---|---|---|---|
| 6,324,056 B1 * | 11/2001 | Breier | G06F 1/20 |
| | | | 165/80.3 |
| 7,057,981 B2 | 6/2006 | Kano et al. | |
| 7,200,008 B1 | 4/2007 | Bhugra | |
| 7,359,186 B2 * | 4/2008 | Honda | G11B 33/142 |
| | | | 361/679.33 |
| 8,191,841 B2 | 6/2012 | Jeffery et al. | |
| 8,238,082 B2 * | 8/2012 | Salpeter | H05K 7/1488 |
| | | | 361/679.02 |
| 8,331,095 B2 | 12/2012 | Hu et al. | |
| 9,141,156 B2 * | 9/2015 | Ross | G06F 1/20 |
| 2003/0147220 A1 | 8/2003 | Fairchild | |
| 2004/0057203 A1 | 3/2004 | Rabinovitz | |
| 2005/0057898 A1 | 3/2005 | El-Batal et al. | |
| 2005/0117462 A1 | 6/2005 | Kano et al. | |
| 2005/0270681 A1 | 12/2005 | Suzuki et al. | |
| 2006/0039108 A1 | 2/2006 | Chikusa et al. | |
| 2006/0087760 A1 | 4/2006 | Forrer et al. | |
| 2006/0176648 A1 | 8/2006 | Inoue et al. | |
| 2006/0187634 A1 | 8/2006 | Tanaka et al. | |
| 2006/0259685 A1 | 11/2006 | Makino | |
| 2007/0035873 A1 | 2/2007 | Hall et al. | |
| 2007/0053169 A1 | 3/2007 | Carlson et al. | |
| 2007/0091559 A1 | 4/2007 | Malone | |
| 2007/0109744 A1 | 5/2007 | Matsushima et al. | |
| 2007/0233781 A1 | 10/2007 | Starr et al. | |
| 2008/0099235 A1 | 5/2008 | Hiramoto et al. | |
| 2009/0144568 A1 | 6/2009 | Fung | |
| 2010/0118484 A1 * | 5/2010 | Sasagawa | H05K 7/20736 |
| | | | 361/679.37 |
| 2011/0185099 A1 | 7/2011 | Stuhlsatz et al. | |

OTHER PUBLICATIONS

International Search Report and Written Opinion from PCT/US2012/029828, dated Jun. 13, 2012, Amazon Technologies, Inc., 14 pages.
Office Action from Japanese Application No. 2014-501189, issued Aug. 26, 2014, English translation, pp. 1-2.
Written Opinion for European Application No. 12761434.5, Dated Sep. 4, 2015. Amazon Technologies, Inc., pp. 1-3.
Extended European Search Report in Application No. 12761434.5, Dated Jul. 22, 2015, pp. 1-5.
Office Action from Canadian Application No. 2,830,068, Dated Jul. 9, 2015, pp. 1-4.
Notice of the Reasons for Refusal from Japanese Patent Application No. 2015-088586, Dated Jan. 19, 2016, pp. 1-8.

* cited by examiner

MODULAR MASS STORAGE SYSTEM

This application is a continuation of U.S. patent application Ser. No. 13/069,065, filed Mar. 22, 2011, now U.S. Pat. No. 8,743,549.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times.

As with other components, hard disk drives fail from time to time while in service. These failures reduce the storage capacity of a system. To restore capacity, servers may need to be powered down and removed from a rack so that the defective hard disk drives can be replaced or repaired.

In some systems, such as archival, backup, or disaster recovery systems, a vast amount of may need to be stored, though any particular piece of the stored data may be accessed only rarely. Magnetic tape systems are often used to store archival data. Magnetic tape drives, however, may be fragile and susceptible to adverse environmental conditions, such as heat and humidity. In addition, some magnetic tape drives have relatively high failure rates.

Figure 1:
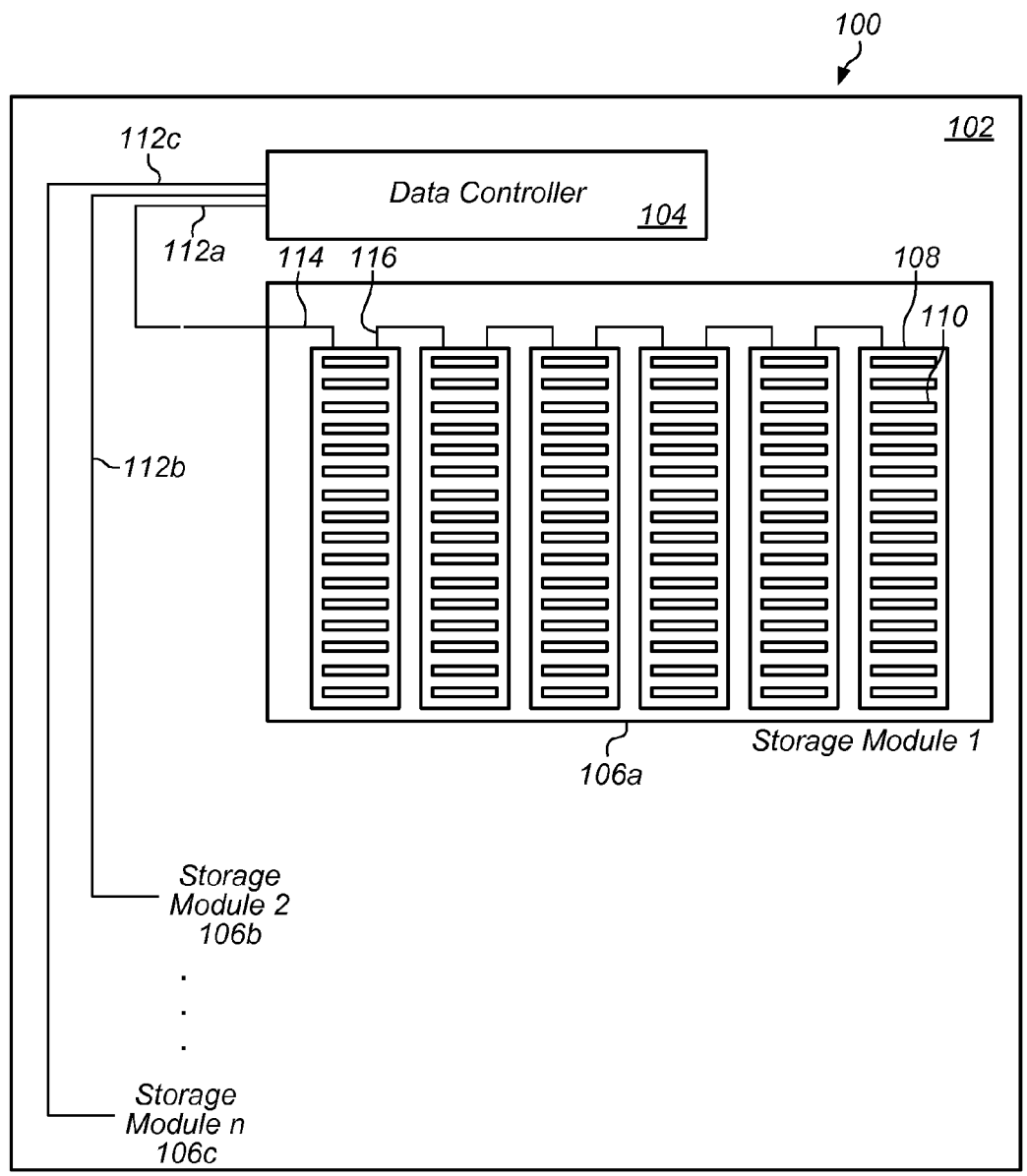
FIG. 1 is a block diagram illustrating one embodiment of a system including a data control module and data storage modules in a rack.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a system for storing data includes a rack, one or more data storage modules coupled to the rack, and one or more data control modules coupled to the rack. The data storage modules may include a chassis, two or more backplanes coupled to the chassis, and one or more mass storage devices (for example, hard disk drives) coupled to the backplanes. The data control modules may access the mass storage devices in the data storage modules.

According to one embodiment, a data storage module includes a chassis, two or more backplanes coupled to the chassis in a primarily horizontal orientation, and two or more hard disk drives coupled to each of the backplanes.

According to one embodiment, a data storage module includes a chassis, one or more backplanes coupled to the chassis in a primarily horizontal orientation, two or more mass storage devices coupled to each of the backplanes, and one or more air passages under the backplanes. The air passages include an air inlet and an air outlet. The air passage allows air to move from the air inlet to the air outlet to remove heat from at least one of the mass storage devices.

According to one embodiment, a method of providing data storage includes providing mass storage devices on two or more backplanes coupled to a common chassis. Some of the mass storage devices are powered down or placed on standby. When the data on one of the mass storage devices needs to be accessed, the mass storage device is powered up or awakened from standby.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "backplane" means a plate or board to which other electronic components, such as mass storage devices, circuit boards, can be mounted. In some embodiments, hard disk drives are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "primarily horizontal" means more horizontal than vertical. In the context of an installed element or device, "primarily horizontal" includes an element or device whose installed width is greater than its installed height.

As used herein, "primarily vertical" means more vertical than horizontal. In the context of an installed element or device, "primarily vertical" includes an element or device whose installed height is greater than its installed width. In the context of a hard disk drive, "primarily vertical" includes a hard disk drive that is installed such that the installed height of the hard disk drive is greater than the installed width of the hard disk drive.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "shock absorbing", as applied to a supporting element for another element, means that the supporting element absorbs mechanical energy and/or dampens shock and/or vibration loads. A shock-absorbing material may be elastic, viscoelastic, viscous, or combinations thereof.

In various embodiments, a data storage system includes one or more data storage modules that are accessed from, and controlled by, a data controller external to the data storage modules. In some embodiments, a data control module and one or more data storage modules coupled to the data control module are included within a rack. FIG. 1 is a block diagram illustrating one embodiment of a system including a data control module and data storage modules in a rack. System 100 includes rack 102, data control module 104, data storage modules 106. Data control module 104 and data storage modules 106 are included in rack 102.

Mass storage devices in data storage modules 106 are coupled to data control module 104. Data control module 104 may access data on any or all of the mass storage devices in data storage modules 106a, 106b, and 106c.

In various embodiments, a data storage module includes two or more circuit boards, each of which carry, and provide electrical connections for, multiple mass storage devices. For example, in the embodiment illustrated in FIG. 1, data storage module 106 includes backplane circuit boards 108. Backplanes circuit boards 108 carry mass storage devices 110. Backplane circuit boards 108 may provide power, data, and signal connections for mass storage devices 110. In various embodiments, each of mass storage devices 110 is a hard disk drive. In one embodiment, each of mass storage devices 110 is a 500 GB hard disk drive with a SATA 3 Gb/s interface.

In the embodiment shown in FIG. 1, each backplane circuit board 108 carries 16 mass storage devices 110. A backplane may, however, carry any number of mass storage devices. In some embodiments, different backplanes within a data storage module carry a different number of mass storage devices.

System 100 includes bus 112a, 112b, and 112c. Bus 112a couples data control module 104 with data storage module 106a. Bus 112b couples data control module 104 with data storage module 106b. Bus 112c couples data control module 104 with data storage module 106c. Buses 112a, 112b, and 112c may each include one or more cables between data control module 104 and data storage modules 106a, 106b, and 106c. Each of buses 112a, 112b, and 112c may provide a connection for data input/output between data controller 104 and one of the data storage modules. In some embodiments, each of buses 112a, 112b, and 112c may provide for data I/O on multiple channels (for example, four channels). Each of data storage modules 106a, 106b, and 106c may be assigned a separate identifier.

In various embodiments, data access and transfer between a data controller and data storage modules in a system may be carried out by way of any suitable computer bus. In some embodiments, data access and transfer is carried out by way of a Serial attached SCSI (SAS) bus. In some embodiments, data access and transfer is carried out by way of a Serial Advance Technology Attachment (SATA) bus.

Connections within each of storage modules 106a, 106b, and 106c may include chaining backplanes within a data storage module. For example, as illustrated in FIG. 1, the left-most backplane is coupled to bus 112a by way of input 114 on backplane circuit board 108. Output 116 on the left-most backplane is coupled to input 114 on the adjacent backplane. Each additional backplane circuit board 108 may be chained to another backplane circuit board in a similar manner, such as is illustrated in FIG. 1.

In some embodiments, each of backplanes 108 includes an expander chip. The expander chip may enable communication with the various mass storage devices 110. Each of backplanes 108 may also include a cascading port for chaining backplanes 108 one to another. In some embodiments, backplanes 108 includes circuitry for conditioning power to mass storage devices 110. In certain embodiments, backplanes 108 may each include a power supply for mass storage devices 110 on the backplane.

For the sake of clarity, the backplanes and mass storage devices are shown only for data storage module 106a. The backplanes and mass storage devices for data storage modules 112b and 112c may be similar to those of data storage module 112a.

Each backplane may include an output for each of the installed mass storage devices 110. In one embodiment, the data input/output interface to backplanes includes four channels. In one embodiment, each of mass storage devices 110 has a 500 GB storage capacity.

Although 3 modules are shown in FIG. 1, in various embodiments any number of data storage modules may be coupled to a data controller.

Figure 2:
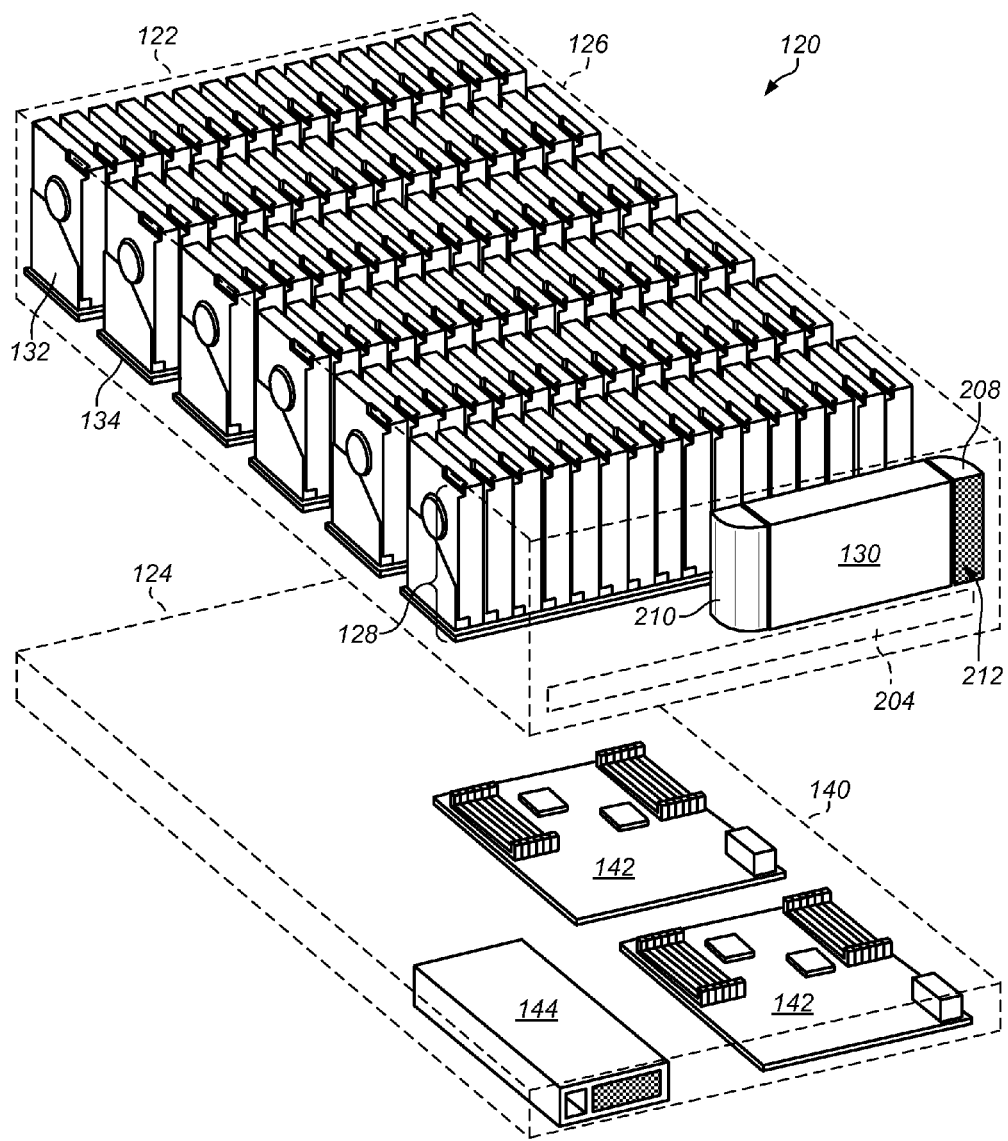
FIG. 2 illustrates one embodiment of a system including a data control module and data storage module having mass storage devices installed on multiple backplanes.

FIG. 2 illustrates one embodiment of a system including a data control module and data storage module having mass storage devices installed on multiple backplanes. System 120 includes data storage module 122 and data control module 124. In some embodiments, data storage module 122 and data control module 124 are mounted in a rack.

Data storage module 122 includes data storage module chassis 126, data storage assemblies 128, power supply unit 130. Data storage assemblies 128 include backplane circuit board assemblies 132 and hard disk drives 134. Backplane circuit board assemblies 132 may be mounted horizontally in data storage module chassis 126. Hard disk drives 134 are installed on backplane circuit board assemblies 132. Hard disk drives 134 may be installed in a vertical orientation. In some embodiments, hard disk drives 134 are installed such that the installed height is the largest dimension of the hard disk drive.

Power supply unit 130 may be coupled to backplane circuit board assemblies 132. Power supply unit 130 may supply power to backplane circuit board assemblies 132 and hard disk drives 134.

Data control module 124 includes data control module chassis 140, control circuit board assemblies 142, and power supply unit 144. Control circuit board assemblies 142 and power supply unit 144 may be mounted on data control module chassis 140. Control circuit board assemblies 142 may access data on hard disk drives 134.

Power supply unit 144 may be coupled to control circuit board assemblies 142. Power supply unit 144 may supply power to control circuit board assemblies 142.

In one embodiment, data storage module 122 is about 4 U in height and data control module 124 is about 1 U in height.

In FIG. 2, data storage module chassis 126 and data control module chassis 140 are represented with a simple box outlines for the sake of clarity. In various embodiments, a chassis for a module may include, or be used in combination with, various structural elements and components for support, mounting, and environmental protection of the elements of the module, such as enclosures, mounting plates, covers, panels, or mounting rails.

In various embodiments, a computing unit includes a power supply that conforms to an industry-recognized standard. In some embodiments, a power supply for a computing unit has a form factor in accordance with an industry-recognized standard. In one embodiment, power supply units 130 and 144 have a standard 1 U form factor. Examples of other standards for a power supply and/or a power supply form factor include 2 U, 3 U, SFX, ATX, NLX, LPX, or WTX.

In the embodiment shown in FIG. 2, data storage module 122 and data control module 124 each include one power supply unit and data storage module data storage module 122 includes 96 hard disk drives. A computer system may, however, have any number of hard disk drives, power supply units, or other components. In certain embodiments, a data storage module or data control module may have one or more internal fans to promote the flow of air through a computer system. For example, in certain embodiments, a row of fans may be provided along the rear edge of data storage module 124. In certain embodiments, a computing unit may have no fans and/or no disk drives. In certain embodiments, a power supply may be external to the storage or computing module. For example, in certain embodiments, control circuit board assemblies 142 of data control module 124 may receive power from a power supply external to data control module chassis 140 (such as a rack-level power supply), and power supply unit 144 may be omitted.

Figure 3:
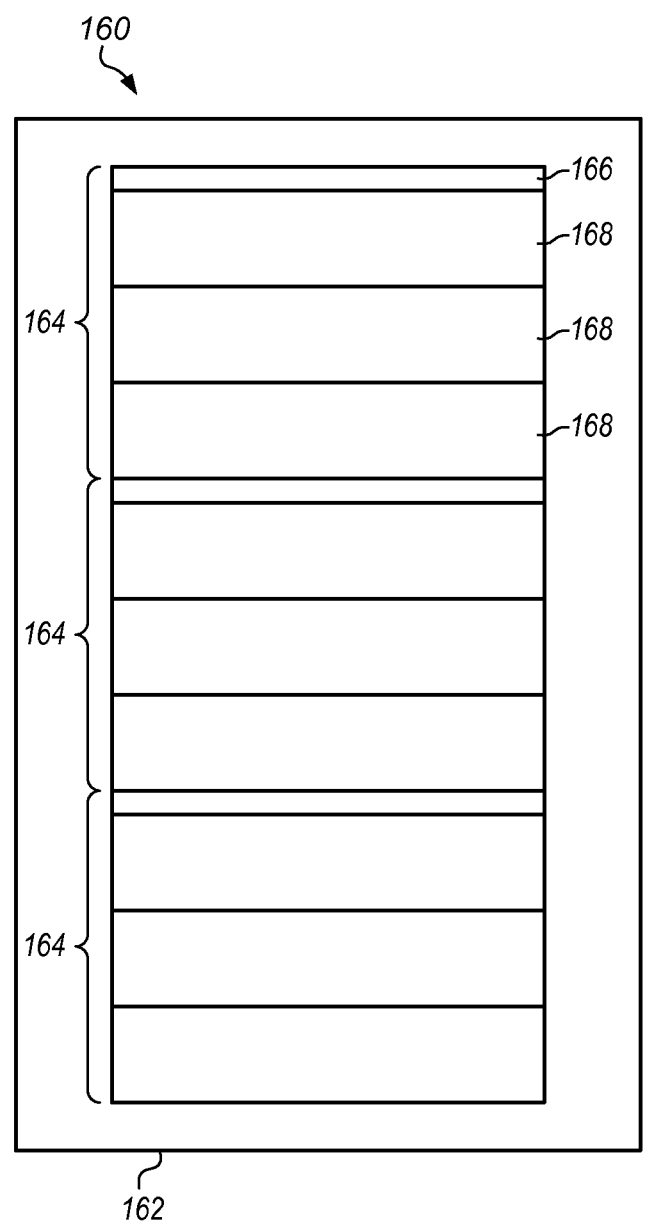
FIG. 3 is a schematic diagram illustrating a front view of three data storage subsystems in a rack.

In some embodiments, a rack includes two or more data storage subsystems having vertically oriented hard disk drives. FIG. 3 is a schematic diagram illustrating a front view of three data storage subsystems in a rack. System 160 includes rack 162 and data storage sub-systems 164. Data storage subsystems 164 each include data control module 166 and three data storage modules 168. In each of data storage subsystems 164, data control module 166 may control, and access data on, data storage modules 168.

In some embodiments, data storage modules 166 include two or more horizontally mounted backplanes carrying vertically oriented hard disk drives. For example, data storage modules 168 may each include 6 backplanes and hard disk drives arranged as described above for data storage module 122.

In one embodiment, each of data storage modules 168 is 4 U in height and each data control module 166 is 1 U in height, for a total of 13 U of height for each sub-system, and a total of 39 U used for the rack. Nevertheless, in various embodiments, data storage modules and data control modules may be any suitable height.

Although in the embodiment shown in FIG. 1, the data controller is shown in the rack, a data controller may be located in any suitable location.

Figure 4:
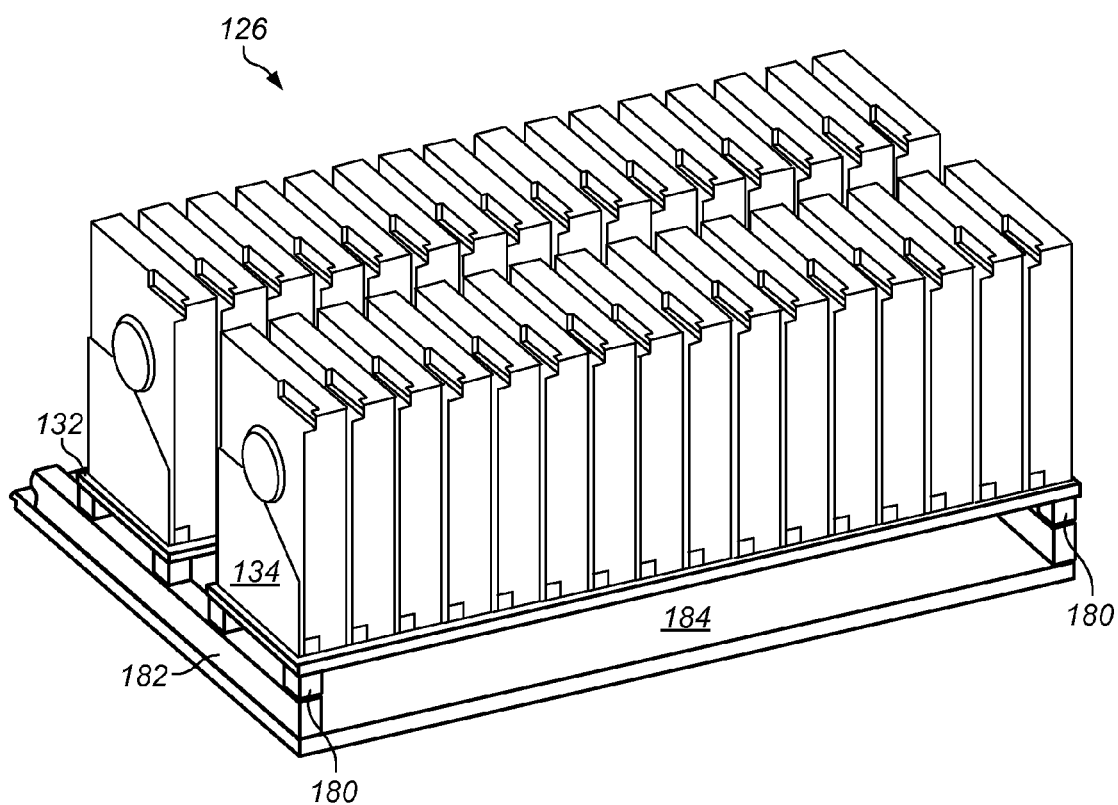
FIG. 4 illustrates one embodiment of disk drive backplanes mounted on pads in a chassis.

In some embodiments, backplanes are mounted to reduce or minimize transmission of shock and/or vibration loads between each hard disk drive and a chassis and between hard disk drives within a module. FIG. 4 illustrates one embodiment of disk drive backplanes mounted on pads in a chassis. Pads 180 are provided on rails 182 on the bottom of data storage module chassis 126. Backplane circuit board assemblies 132 are mounted on pads 180. Pads 180 may be made of a shock absorbing material, such as an elastomeric material. Pads 180 may reduce transmission of shock and/or vibration between data storage module chassis 126 and hard disk drives 134.

In some embodiments, elements of disk drive backplanes and a chassis may combine to form a box section mounting for hard disk drives. For example, chassis bottom panel 184, rails 186, and one or more of backplane circuit board assemblies 132 may combine to form a rectangular box section. The box section may reduce deformation of a chassis, such as sagging of chassis bottom panel 184, which might occur if hard disk drives 134 were installed directly on bottom panel 184 of data storage module chassis 126. In some embodiments, rails, pads, a tray, or similar structural elements may serve multiple functions, including forming the box section structure, space for cable runs, and space for air flow.

Figure 5:
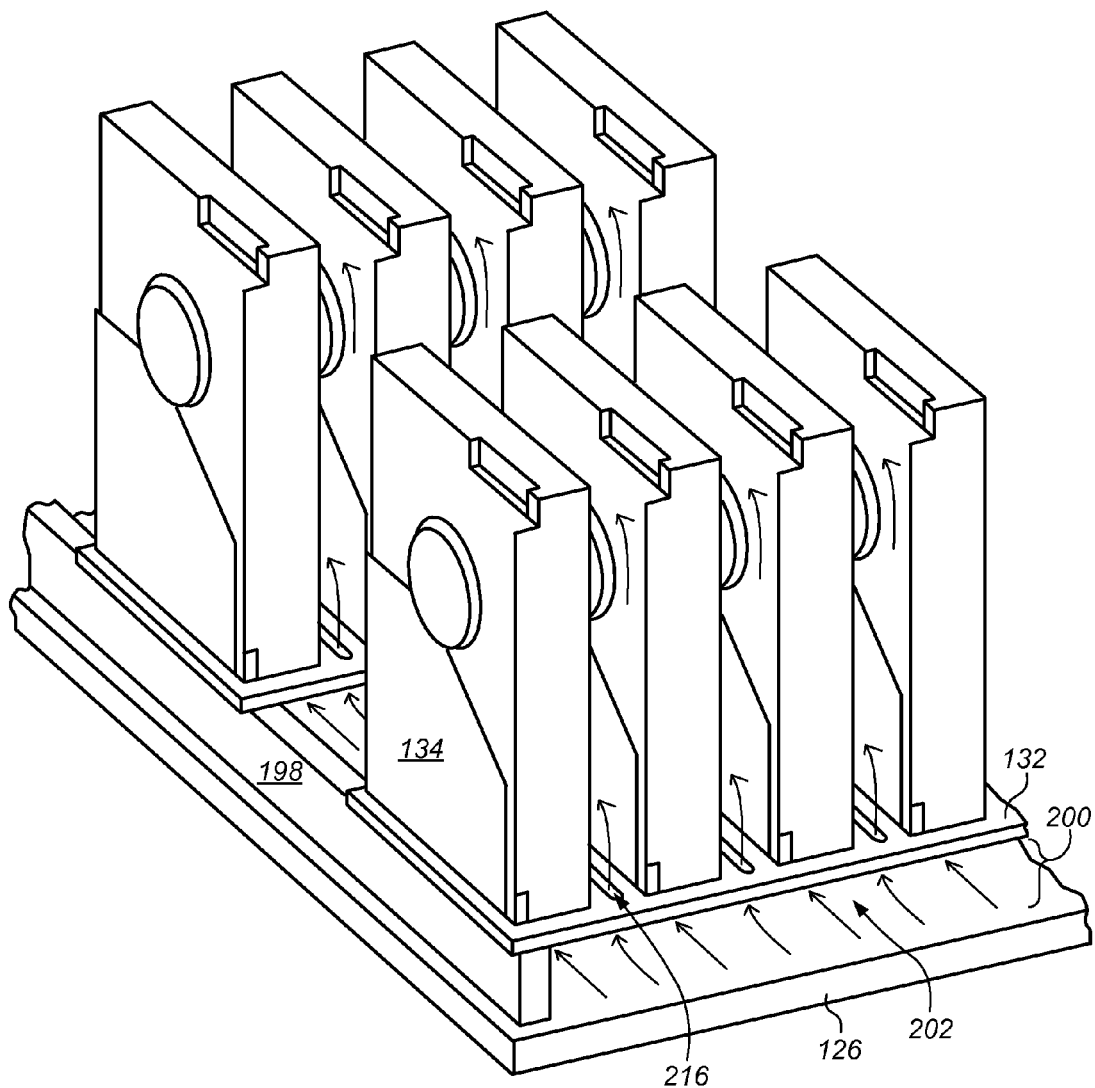
FIG. 5 illustrates one embodiment of venting of airflow from under mass storage device backplanes.

In some embodiments, a system includes an air passage under two or more mass storage device backplanes. FIG. 5 illustrates a data storage module that includes risers. Backplane circuit boards 132 may be mounted on backplane circuit board 132. Risers 198 may space backplane circuit boards 132 from the floor of chassis to form gap 200. Gap 200 may define air passage 202 under backplane circuit board assemblies 132. Air passage 202 may extend continuously from the foremost backplane circuit boards 108 to the rearmost of backplane circuit board assemblies 132.

As shown in FIG. 2, air may flow in through front vents 204 in the front of data storage module chassis 126. In the embodiments shown in FIG. 2, front vents 204 are located near the bottom of data storage module chassis 204. Front vents may, however, be in any location on the front of a chassis or enclosure. Air may be moved from front to rear of data storage module chassis 126 by one or more air moving devices. The air moving devices may be located external to data storage module chassis 126, in or on data storage module chassis 126, or both. Air may flow through air passage 202 under backplane circuit board assemblies 132 and exit through the rear of data storage module chassis 126.

Still referring to FIG. 2, data storage module 122 may include power supply inlet plenum 208 and power supply exit plenum 210. Some of the air at the front of data storage module chassis 126 may pass into power supply inlet plenum 208 through power supply front inlet 212 and into a housing for power supply unit 130. Air flowing through the power supply housing may exit the housing and pass into power supply exit plenum 210. In certain embodiments, air may be ducted to the bottom of the chassis (for example, under backplane circuit boards 132.

In some embodiments, air from power supply exit plenum may mix with air coming into data storage module chassis 126 before passing under backplane circuit boards 132. In certain embodiments, exhaust air from power supply unit 144 may be segregated from other air entering data storage module chassis 130, for example, by a duct that carries the exhaust air from the power supply unit to the rear of data storage module chassis 126.

In certain embodiments, a power supply is oriented in a module such that the exhaust air from the module is directed under mass storage backplanes in a chassis. For example, power supply unit 130 shown in FIG. 2 may be rotated 90 degrees counterclockwise such that air flowing through the power supply unit exits the power supply unit near the bottom of the chassis.

In some embodiments, air flowing under mass storage device backplanes may be vented upwardly so as to remove heat from the mass storage devices. For example, as shown in FIG. 5, air flow may be vented from under mass storage device backplanes. Air may flow under backplane circuit board assemblies 132 in air passage 202 between the backplanes and the bottom of data storage module chassis 126. At each of backplane circuit boards 132, some of the air flowing from the front to the rear of the chassis may be vented through openings 216 in backplanes circuit board assemblies 132 between hard disk drives 134. Air may rise through openings 216 upwardly across the surfaces of hard disk drive 134. Some of the air may reach the top of the chassis. The air passing upwardly over hard disk drives 134 may remove heat from hard disk drives 134. Air passing upwardly across hard disk drives 134 may move toward the rear of data storage chassis 126.

In some embodiments, the size and number of opening in a backplane may be selected to tune the air flow through various hard disk drives in a chassis. For example, in one embodiment, the vents for the backplanes near the rear of the chassis may larger than the vents for the backplanes near the front of the chassis, since a greater airflow may be required near the rear of the chassis because of the relatively warm air in that portion of the chassis.

Figure 6:
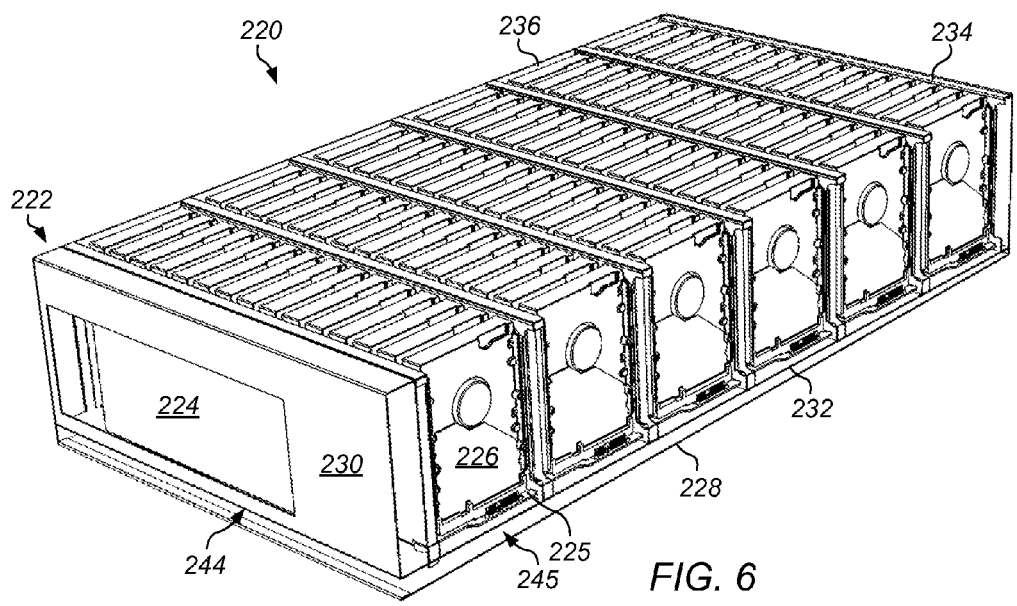
FIG. 6 illustrates one embodiment of a data storage module including a shelf and cross braces for hard disk drives with hard disk drives installed on the shelf.

FIG. 6 illustrates one embodiment of a data storage module including a shelf and cross braces for hard disk drives with hard disk drives installed on the shelf. Data storage module 220 includes chassis assembly 222, power supply unit 224, and hard disk drives 226. Chassis assembly 222 includes base panel 228, front housing 230, shelf 232, cross braces 234, and left side panel 236. Chassis assembly 222 may also include a right side panel (a right-side panel has been omitted from FIG. 6 for illustrative purposes).

In the embodiment shown in FIG. 6, Cross braces 234 are provided between each of backplane circuit board assemblies 234. In other embodiments, however, cross braces may be provided between only certain rows of hard disk drives, or omitted altogether.

In some embodiments, shelf 232 is mounted on shock absorbing elements. For example, an array of shock absorbing pads may be provided between shelf 232 and base panel 228.

Cross braces 234 are mounted on shelf 232. Hard disk drives 226 are installed on backplane circuit board assemblies 225 between cross braces 234.

In the embodiment shown in FIG. 6, power supply unit 224 is mounted such that its length runs transversely relative to the front of the chassis (for example, lengthwise left to right). Opening 244 is provided at the front of chassis assembly 222. Opening 244 may allow air at the front of data storage module 220 to pass into air passage 245 formed between base panel 228 and shelf 232. Air passage 245 may run the length of data storage module 220 from front to back. Air passage 245 may supply air for removing heat from hard disk drives 226.

Figure 7:
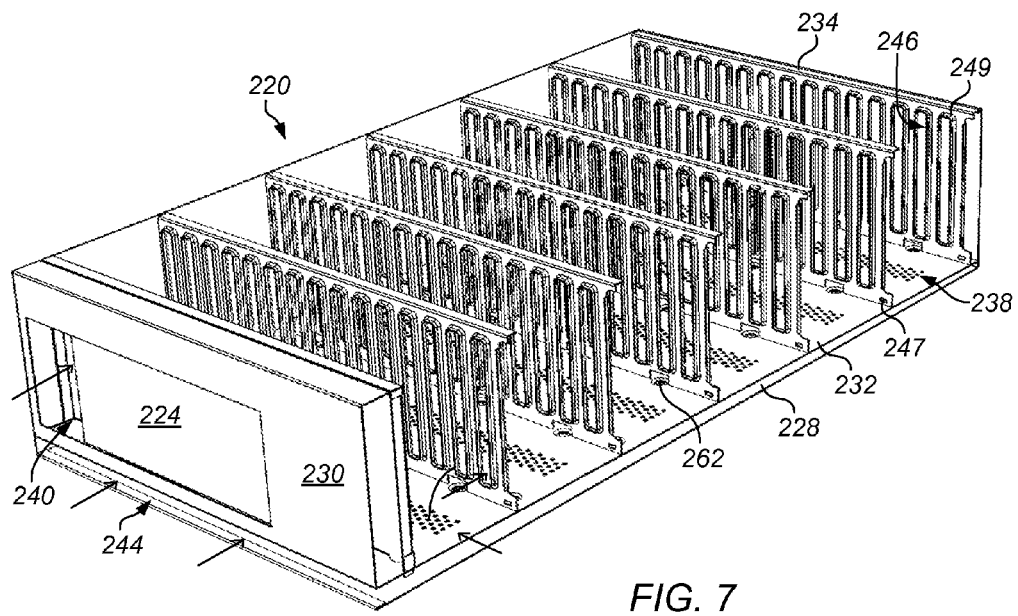
FIG. 7 illustrates one embodiment of a data storage module including a shelf and cross braces for hard disk drives with hard disk drives removed.

FIG. 7 illustrates one embodiment of a data storage module including a shelf and cross braces for hard disk drives with hard disk drives removed for illustrative purposes. In addition, rear-facing members of the cross braces have been omitted for clarity. In some embodiments, rear-facing cross brace members are identical to the front-facing cross brace members.

Cross braces 234 include guide rims 249. Guide rims 249 include openings 246. Cross braces 234 may stiffen chassis assembly 222 and inhibit sagging of chassis elements under the weight of hard disk drives 226. Guide rims 249 may serve as guides for hard disk drives 226. Openings 246 may provide a path for front-to-back air flow through cross braces 234 between adjacent hard disk drives 226.

Figure 8:
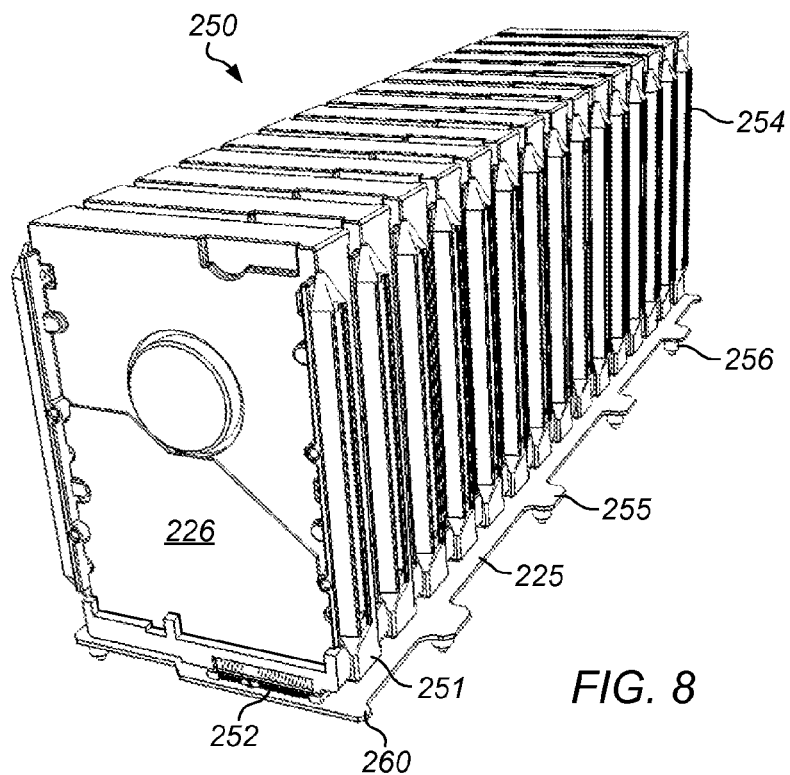
FIG. 8 is a top perspective view of one embodiment of a hard disk drive assembly including a backplane circuit board.
Figure 9:
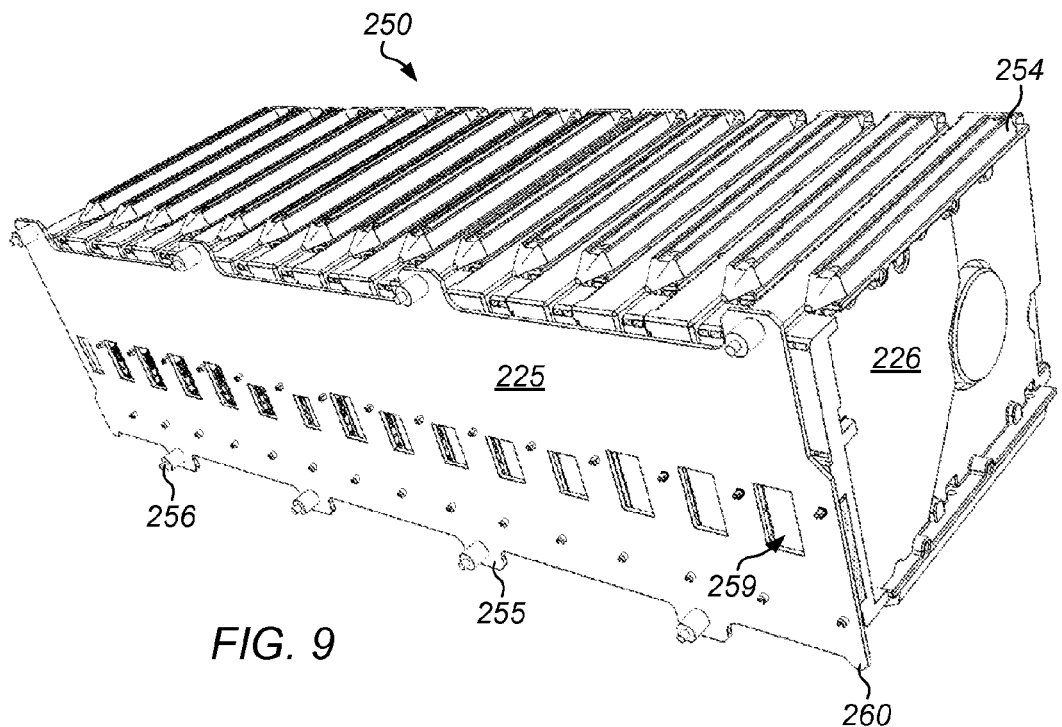
FIG. 9 is a bottom perspective view of one embodiment of a hard disk drive assembly including a backplane circuit board.

FIG. 8 is a top perspective view of one embodiment of a disk storage assembly including a backplane circuit board. FIG. 9 is a bottom perspective view of one embodiment of a disk storage assembly including a backplane circuit board. Disk storage assembly 250 includes hard disk drives 226 and backplane circuit board assembly 225. Hard disk drives 226 may mount on backplane circuit board assembly 225 at base 251. Connectors 252 may electrically couple hard disk drives 226 to backplane circuit board assembly 225.

Each of hard disk drives 226 may be provided with a pair of opposing rails 254. In some embodiments, rails 254 may serve as a handle for hard disk drives 226.

Backplane circuit board assembly 225 may include tabs 255 and mounting pads 256. In some embodiments, mounting pads 256 are made of a shock-absorbing material. In certain embodiments, mounting pads 256 include threads (for example, for installing a backplane on a chassis). Tabs 260 may engage in slot 247 on cross brace 234.

Figure 10:
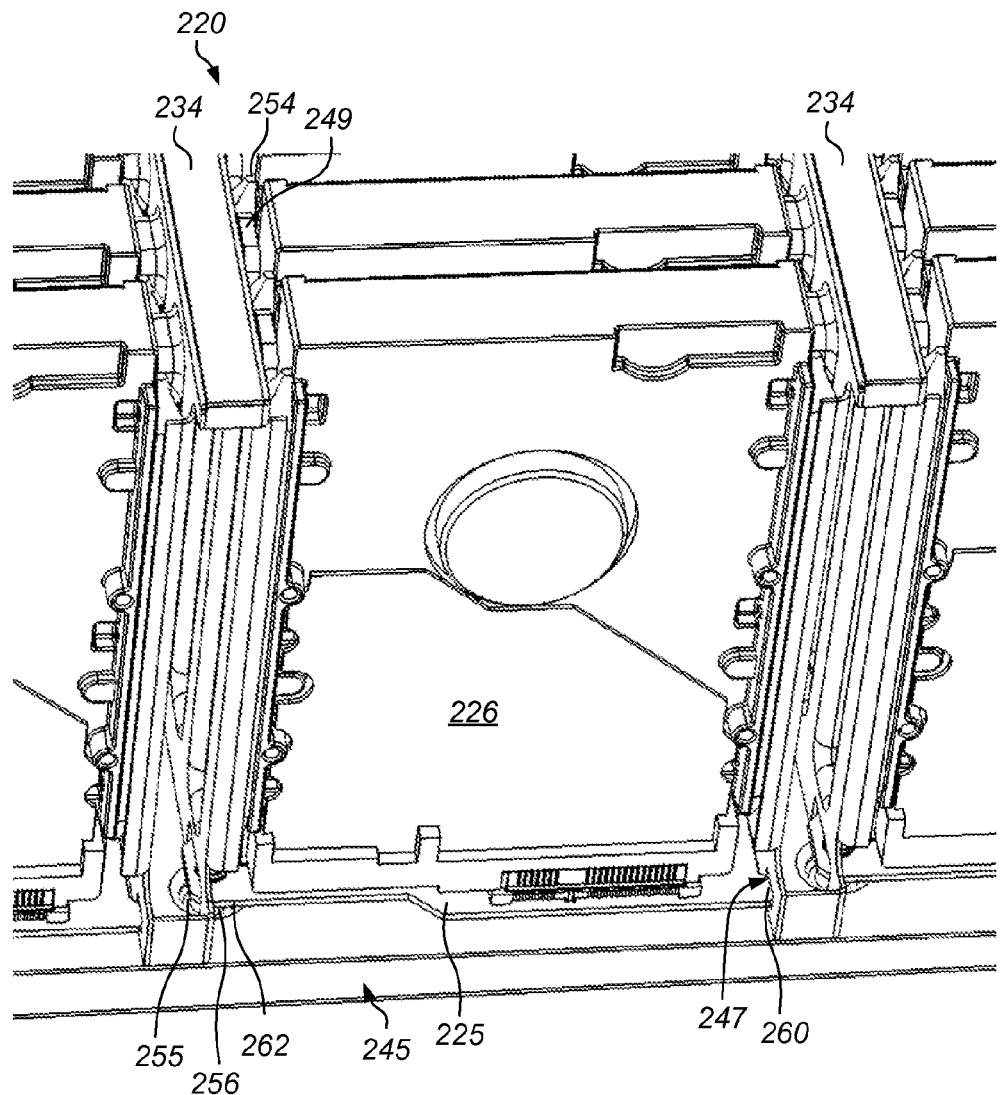
FIG. 10 is illustrates one embodiment of an installation of hard disk drives in a data storage module.

FIG. 10 is illustrates one embodiment of an installation of hard disk drives in a data storage module. Tabs 255 on backplane circuit board assembly 225 may extend into corresponding slots in cross brace 234. Pads 256 may be installed in sockets 262 of shelf 232.

Rails 254 of hard disk drives 226 may slide in between the edges of adjacent rims 249. Hard disk drives 226 may slide in and out from the top of the chassis. In some embodiments, rails 254 provide shock or vibration isolation for the hard disk drives. In certain embodiments, for example, rails 254 are made of, or include, an elastomeric material, such as rubber. The rail may dampen shock or vibration loads and/or isolate a particular drive from vibration in other drive, on the backplane, or external to the backplane.

Referring again to FIG. 7, during operation, air at the front of data storage module 250 may flow into power supply opening 240 and opening 244. Air entering through power supply opening 240 may pass through an enclosure for power supply unit 224. The air may exit the power supply enclosure through vent 242. Air exhausted from vent 242 of power supply unit 224 may mix with air entering chassis assembly 224 through opening 244. The mixed air may continue through air passage 245. Some of the air moving from front to rear in air passage 245 may pass through shelf vents 238 in shelf 332 and through backplane openings 259 (shown in FIG. 9). Air that has been vented through shelf vents 238 may flow upwardly across hard disk drives 226 and rearward through openings 246 in cross braces 234, thereby removing heat from hard disk drives 226. Air may flow through openings 246 in cross braces 234 until it reaches the rear of chassis assembly 222.

Figure 11:
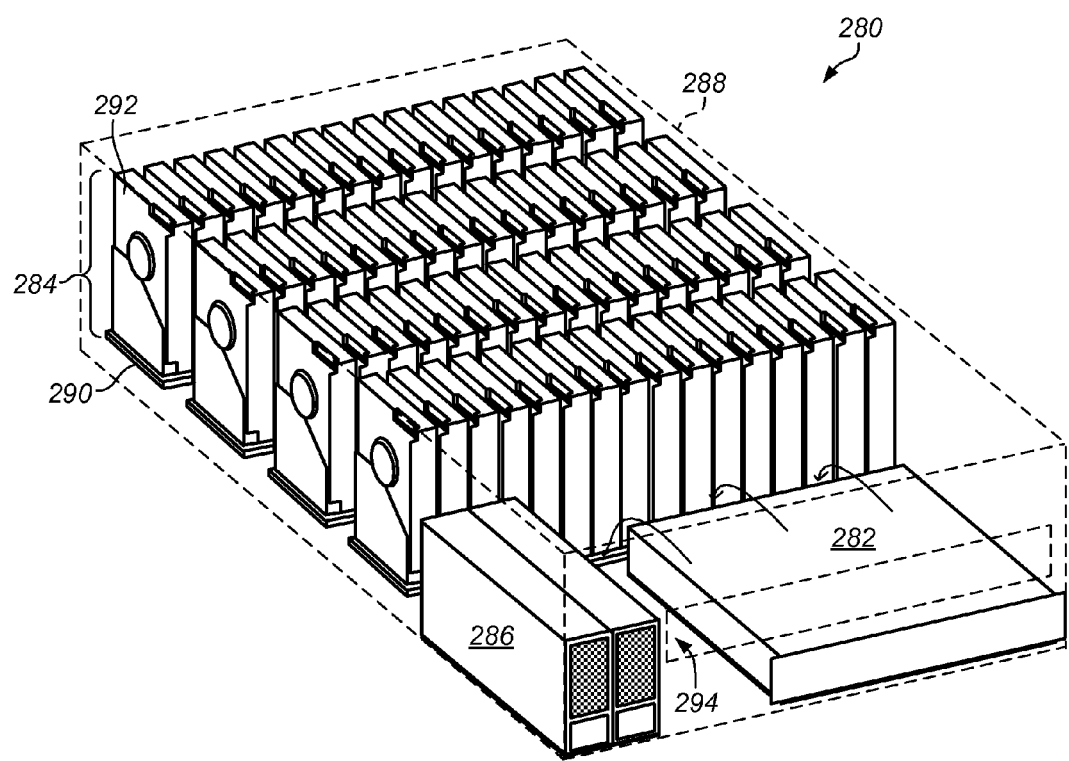
FIG. 11 illustrates one embodiment of a module that includes a data controller and multiple disk drive backplanes.

In some embodiments, a data storage module includes a data controller and two or more backplanes having multiple mass storage devices. The data controller and the backplanes may be supported on a common chassis. In some embodiments, the module includes hard disk drives mounted on the backplanes in a vertical orientation. FIG. 11 illustrates one embodiment of a module that includes a data controller and multiple disk drive backplanes. Data storage module 280 includes controller 282, data storage assemblies 284, power supply units 286, and chassis 288. Controller 282, data storage assemblies 284, and power supply units 286 are mounted on chassis 288.

Data storage assemblies 284 include backplane circuit board assemblies 290 and hard disk drives 292. Backplane circuit board assemblies 290 may be mounted horizontally in data storage module chassis 288. Hard disk drives 292 are installed on backplane circuit board assemblies 290. Hard disk drives 292 are installed in a vertical orientation, similar to that described above relative to FIG. 2. Each of backplane circuit board assemblies may carry, and provide electrical connections for, multiple hard disk drives 232.

Power supply units 286 may be coupled to backplane circuit board assemblies 290. Power supply units 286 may supply power to backplane circuit board assemblies 290 and hard disk drives 292.

In some embodiments, air flows from front to rear in a module such that air downstream from a controller or motherboard assembly flows under two or more mass data storage backplanes. For example, as shown by the arrows in FIG. 11, air may pass into front vents 294 of chassis 288 and over controller 282. Air downstream from controller 282 may flow under backplane circuit board assemblies 290. In some embodiments, air exhausted from power supply units 286 mixes with air downstream from controller 282 before passing under backplane circuit board assemblies 290.

Figure 12:
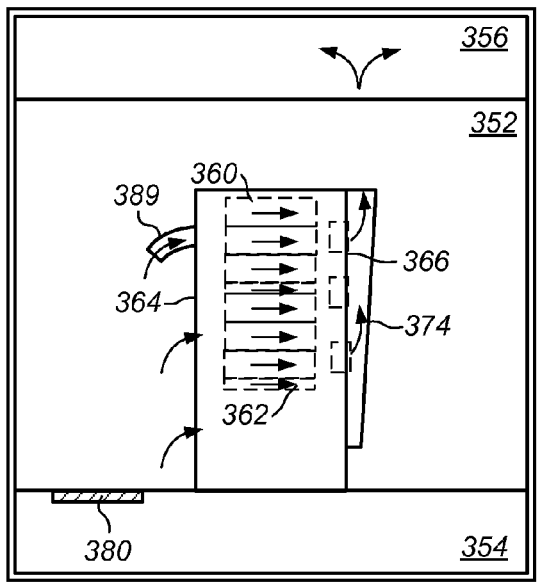
FIG. 12 illustrates one embodiment of removal of heat from data storage modules in a rack system.

FIG. 12 illustrates one embodiment of removal of heat from data storage modules in a rack system. Air may pass into computing room 352 from sub-floor plenum 354 by way of vent 380. Rear fans 366 in fan door 374 may draw air from front aisle 368 into rack 364, and through data storage modules 360 and data control modules 362. Rear fans 366 may exhaust heated air out of the rack. The heated air may pass into ceiling plenum 356. Air directing device 389 is provided on the front or rack. Air directing device 389 may be used to promote airflow in particular modules mounted in the rack. Other arrangements of air movers may be included in various embodiments. U.S. patent application Ser. No. 12/646,417, "Air Directing Device for Rack System", filed Dec. 23, 2009; U.S. patent Ser. No. 12/751,212, "Rack-Mounted Air Directing Device with Scoop", filed Mar. 30, 2010; and U.S. patent application Ser. No. 12/886,440, "System with Rack-Mounted AC Fans", filed Sep. 9, 2010, each of which is incorporated by reference as if fully set forth herein, include other arrangements, systems, devices, and techniques that may be used in various embodiments for cooling or mounting computing modules, data storage modules and data control modules.

Figure 13:
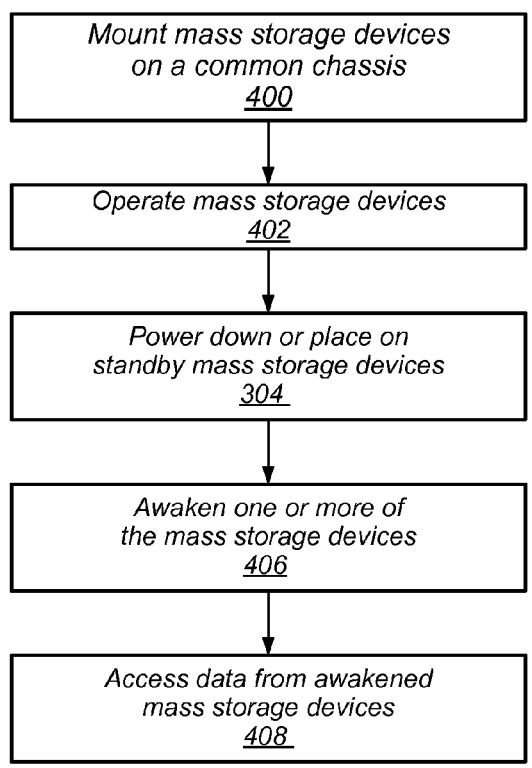
FIG. 13 illustrates a method of providing data storage that includes providing mass storage devices on two or more backplanes coupled to a common chassis.

In some embodiments, mass data storage is provided on multiple backplanes in a common chassis. FIG. 13 illustrates a method of providing data storage that includes providing mass storage devices on two or more backplanes coupled to a common chassis. At 400, two or more mass storage backplanes are mounted on a common chassis. The mass storage devices may be, for example, hard disk drives. The backplanes may be in horizontal orientation on the chassis. The hard disk drives may be in a vertical orientation. In one embodiment, data storage and control are provided in a data storage module and data control module similar to those described above relative to FIG. 2. In certain embodiments, the backplanes are coupled to one another and at least one of the backplanes is coupled to a data controller. The data controller may be external to the chassis in which the backplanes are mounted.

At 402, some or all of the mass storage devices on the backplanes may be placed into operation. For example, the mass storage devices may provide storage capacity in a data center.

At 404, some or all of the mass storage devices on the backplanes may be powered down or placed on standby. The powered down or standby mass storage devices may be considered to be in a cold storage state. At 406, one or more of the mass storage devices that are powered down or on standby are awakened. At 408, data from the mass storage devices that have been awakened is accessed.

Upon failure of a hard disk drive in a module, the module may be removed or withdrawn from its installed position in a rack. The failed hard disk drive may be removed and replaced by way of the top of the module.

In certain embodiments, a computing module includes mass storage devices that are mounted in two or more different orientations. In one embodiment, a computing unit includes one or more hard disk drives mounted in a horizontal orientation and one or more hard disk drives mounted in a vertical orientation.

In some embodiments, hard disk drives in a data storage module are standard, off-the-shelf disk drives. Examples of suitable hard disk drive form factors may include 3.5", 5.25", and 2.5". In one embodiment, a standard 3.5" hard disk drive is installed such that the installed height of the hard disk drive is the largest dimension.

In some embodiments, rack-mounted computing modules are commonly cooled by a cooling air system that delivers air to the rack. To remove heat from computing modules installed in the rack, an air handling system may be operated to cause air to flow in computer room and through the rack system. As the air reaches the front of each of computing modules, the air may pass through the chassis of the computing modules. After passing through the chassis, the heated air may exit the rear of the rack system and flow out of the computer room. In certain embodiments, computing modules may have on board fans in addition to, or lieu of, a central cooling system. In certain embodiments, a rack may have a fan that supplies cooling air to all of the computing modules in the rack.

Although in the embodiments described above, the hard disk drives are mounted on pads and rails, in various embodiments, hard disk drives or other data storage devices may be mounted to a chassis using other mounting elements. For example, hard disk drives and/or backplanes for the disk drives may be mounted on square tubes that support the drives and raise the drives above the bottom of a chassis.

In some embodiments, a rack system includes rack-mounted fans external to computer systems in the rack. The rack-mounted fans may provide air flow through the computer systems.

For clarity, modules in many of the figures herein have been shown with a simple box outline around functional components. In various embodiments, a module or a chassis for a module may include an enclosure, a tray, a mounting plate, a combination thereof, as well as various other structural elements.

Although in the embodiments described above, some of the data storage modules have been described as being 4 U in height, modules may in various embodiments be 3 U, 4 U, 6 U or any other height or dimensions.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for storing data, comprising:
   a rack;
   one or more data storage modules coupled to the rack, at least one of the data storage modules comprising:
      a chassis;
      at least one backplane coupled to the chassis, wherein the at least one backplane is configured to be coupled to by at least one mass storage device and wherein the at least one backplane comprises one or more openings in the at least one backplane; and
      at least one air passage under the at least one backplane, wherein the at least one air passage comprises at least one air inlet and at least one air outlet and is configured to allow air to move from the at least one air inlet to the at least one air outlet to remove heat from at least one mass storage device coupled to the at least one backplane, wherein the one or more openings in the at least one backplane is configured to allow air from the at least one air passage to flow through the one or more openings to remove heat from the at least one data storage device.

2. The system of claim 1, wherein the at least one backplane in at least one of the data storage modules is in a primarily horizontal orientation and is configured to be coupled to by at least one mass storage device in a primarily vertical orientation.

3. The system of claim 1, wherein, for at least one of the data storage modules, the at least one backplane is configured to couple with a data control module which is external to the chassis of at least one of the data storage modules, wherein the at least one of the data storage modules further comprises at least a second backplane, coupled to the chassis, which is configured to be chained for data communication to the at least one backplane.

4. The system of claim 1, wherein the one or more data storage modules comprise two or more data storage modules coupled to the rack.

5. The system of claim 4, wherein the two or more storage modules comprise three storage modules, wherein at least one of the mass storage devices in at least one of the data storage modules is installed on the backplane such that the installed height is the largest dimension of the mass storage device.

6. The system of claim 1, wherein the at least one mass storage device is a hard disk drive configured to be placed into a standby or off state and to be woken from the standby or off state to enable access to data stored on the hard disk drive.

7. The system of claim 1, further comprising at least one multi-channel connection between at least one of the data storage modules and a data control module, wherein the multi-channel connection comprises:
a connection on a first channel between the data control module and at least a first hard disk drive on the at least one backplane; and
a connection on a second channel between the data control module and at least a second hard disk drive on the at least one backplane.

8. The system of claim 1, further comprising at least one air moving device configured to move air through a data control module and at least one of the data storage modules.

9. An apparatus, comprising:
a chassis;
at least one backplane coupled to the chassis in a primarily horizontal orientation, wherein the at least one backplane is configured to be coupled to by at least one electronic component, and wherein the at least one backplane comprises one or more openings in the at least one backplane, wherein the one or more openings are configured to allow air to flow through the backplane to remove heat from the at least one electronic component; and
one or more power supply units transversely mounted in the chassis and configured to supply electrical power to at least one electronic component coupled to the at least one backplane.

10. The apparatus of claim 9, further comprising at least one air passage under the at least one backplane, wherein the at least one air passage comprises at least one air inlet and at least one air outlet, wherein the at least one air passage is configured to allow air to move from the at least one air inlet to the at least one air outlet to remove heat from at least one electronic component coupled to the at least one backplane.

11. The apparatus of claim 9, wherein the at least one backplane is configured to enable the at least one electronic component to be installed on the at least one backplane such that the installed height is the largest dimension of the at least one electronic component.

12. The apparatus of claim 9, further comprising one or more circuit board assemblies coupled to the chassis and configured to access the at least one electronic component.

13. The apparatus of claim 9, wherein:
the at least one electronic component comprises two or more hard disk drives;
the at least one backplane comprises at least six backplanes coupled to the chassis, and
each of the backplanes is configured to support the two or more hard disk drives, wherein the hard disk drives are configured to couple with a data control module external to the apparatus.

14. The apparatus of claim 9, wherein:
the at least one backplane comprises at least two backplanes; and
the apparatus further comprises one or more cross members between the at least two backplanes.

15. The apparatus of claim 14, wherein at least one of the cross members comprises at least one guide for at least one of the electronic components.

16. The apparatus of claim 14, wherein at least one of the cross members comprises one or more openings located at least partially between two adjacent electronic components on at least one of the at least two backplanes, wherein the one or more openings are configured to allow air to pass from the front of the cross member to the back of the cross member.

17. The apparatus of claim 14, further comprising one or more guide rails coupled to at least one of the electronic components, wherein the guide rail is configured to couple with at least one guide on at least one of the cross members, wherein the at least one guide rail is configured to at least partially isolate the at least one of the electronic components from external vibration loads.

18. An apparatus, comprising:
a chassis;
at least one backplane coupled to the chassis in a primarily horizontal orientation, wherein the at least one backplane is configured to enable at least one electronic component to couple to the at least one backplane, and wherein the at least one backplane comprises one or more openings in the at least one backplane; and
at least one air passage under the at least one backplane, wherein the at least one air passage comprises at least one air inlet and at least one air outlet and is configured to allow air to move from the at least one air inlet to the at least one air outlet to remove heat from the at least one electronic component coupled to the at least one backplane, and wherein the one or more openings in the at least one backplane are configured to allow air from the at least one air passage to flow through the one or more openings to remove heat from the at least one electronic component.

19. The apparatus of claim 18, wherein the at least one backplane is coupled transversely to a front of the chassis.

20. The apparatus of claim 19, wherein the at least one backplane is in a primarily horizontal orientation and is configured to be coupled to by at least one electronic component in a primarily vertical orientation.

* * * * *